(12) United States Patent
Hirai et al.

(10) Patent No.: US 12,327,596 B2
(45) Date of Patent: Jun. 10, 2025

(54) SEMICONDUCTOR STORAGE DEVICE

(71) Applicant: Kioxia Corporation, Tokyo (JP)

(72) Inventors: Ryota Hirai, Chigasaki Kanagawa (JP); Daisuke Arizono, Yokohama Kanagawa (JP); Yasuhiro Shiino, Fujisawa Kanagawa (JP); Takuya Kusaka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 599 days.

(21) Appl. No.: 17/463,693

(22) Filed: Sep. 1, 2021

(65) Prior Publication Data
US 2022/0262444 A1 Aug. 18, 2022

(30) Foreign Application Priority Data

Feb. 18, 2021 (JP) .................. 2021-024460

(51) Int. Cl.
| | | |
|---|---|---|
| *G11C 16/08* | (2006.01) | |
| *G11C 16/04* | (2006.01) | |
| *G11C 16/12* | (2006.01) | |
| *G11C 16/26* | (2006.01) | |
| *G11C 16/30* | (2006.01) | |
| *G11C 16/32* | (2006.01) | |
| *G11C 16/34* | (2006.01) | |

(52) U.S. Cl.
CPC ........ *G11C 16/349* (2013.01); *G11C 16/0433* (2013.01); *G11C 16/0483* (2013.01); *G11C 16/08* (2013.01); *G11C 16/12* (2013.01); *G11C 16/26* (2013.01); *G11C 16/30* (2013.01); *G11C 16/32* (2013.01); *G11C 16/3404* (2013.01)

(58) Field of Classification Search
CPC .............. G11C 16/349; G11C 16/0433; G11C 16/0483; G11C 16/08; G11C 16/12; G11C 16/26; G11C 16/30; G11C 16/32; G11C 16/3404; G11C 2029/1202; G11C 8/04; G11C 16/10; G11C 29/021; G11C 29/025; G11C 16/14; G11C 2211/5642; G11C 7/12; G11C 8/08; G11C 29/42
See application file for complete search history.

(56) References Cited

U.S. PATENT DOCUMENTS

| | | |
|---|---|---|
| 7,948,804 B2 | 5/2011 | Komatsu |
| 8,223,557 B2 | 7/2012 | Komatsu |

(Continued)

FOREIGN PATENT DOCUMENTS

| | | |
|---|---|---|
| JP | H07192479 A | 7/1995 |
| JP | 5172555 B2 | 3/2013 |

(Continued)

*Primary Examiner* — Jay W. Radke
(74) *Attorney, Agent, or Firm* — Holtz, Holtz & Volek PC

(57) ABSTRACT

A non-volatile memory of an embodiment includes: a memory cell array including a plurality of memory cell transistors; a plurality of word lines connected to a plurality of gates of the plurality of respective memory cell transistors; a VPGM monitor connected to at least one of the plurality of word lines; and a sequencer. When writing voltage is applied to a selected word line selected from among the plurality of word lines at data writing to the memory cell array, the sequencer detects voltage of the selected word line through the VPGM monitor and determines whether detected voltage obtained through the detection has reached a predetermined value.

19 Claims, 14 Drawing Sheets

(56) References Cited

U.S. PATENT DOCUMENTS

| | | | |
|---|---|---|---|
| 8,391,074 B2 | 3/2013 | Komatsu | |
| 8,787,093 B2 | 7/2014 | Komatsu | |
| 9,349,460 B2 | 5/2016 | Komatsu | |
| 9,666,286 B2 | 5/2017 | Lee | |
| 9,754,662 B2 | 9/2017 | Komatsu | |
| 2002/0139999 A1 | 10/2002 | Hirano | |
| 2005/0117399 A1* | 6/2005 | Kwon | G11C 8/08 365/185.28 |
| 2005/0232048 A1* | 10/2005 | Kuo | G11C 16/32 365/222 |
| 2006/0279994 A1* | 12/2006 | Park | G11C 16/3404 365/185.18 |
| 2007/0047315 A1* | 3/2007 | Aritome | G11C 16/102 365/185.18 |
| 2014/0359202 A1* | 12/2014 | Sun | G11C 7/14 365/185.11 |
| 2015/0270005 A1* | 9/2015 | Choi | G11C 8/18 365/185.11 |
| 2016/0267980 A1* | 9/2016 | Akamine | G11C 29/42 |
| 2020/0294579 A1 | 9/2020 | Midorikawa | |
| 2021/0065823 A1 | 3/2021 | Endo et al. | |
| 2021/0125673 A1 | 4/2021 | Tachi et al. | |
| 2021/0343351 A1* | 11/2021 | Chiang | G11C 16/0483 |
| 2022/0187365 A1* | 6/2022 | Song | G11C 29/12005 |

FOREIGN PATENT DOCUMENTS

| | | |
|---|---|---|
| JP | 2021039805 A | 3/2021 |
| JP | 2021072139 A | 5/2021 |

* cited by examiner

SEMICONDUCTOR STORAGE DEVICE

CROSS-REFERENCE TO RELATED APPLICATIONS

This application is based upon and claims the benefit of priority from the prior Japanese Patent Application No. 2021-24460 filed in Japan on Feb. 18, 2021; the entire contents of which are incorporated herein by reference.

FIELD

An embodiment described herein relates generally to a semiconductor storage device.

BACKGROUND

There is a semiconductor storage device that omits verify operation.

DETAILED DESCRIPTION

A semiconductor storage device of an embodiment includes: a memory cell array including a plurality of memory cell transistors; a plurality of word lines connected to a plurality of gates of the plurality of respective memory cell transistors; a voltage detection circuit connected to at least one of the plurality of word lines; and a control circuit configured to detect, when writing voltage is applied to a selected word line selected from among the plurality of word lines at data writing to the memory cell array, voltage of the selected word line through the voltage detection circuit, and perform determination whether detected voltage obtained through the detection has reached a predetermined value.

An embodiment will be described below with reference to the accompanying drawings.

(Configuration of Memory System)

Figure 1:
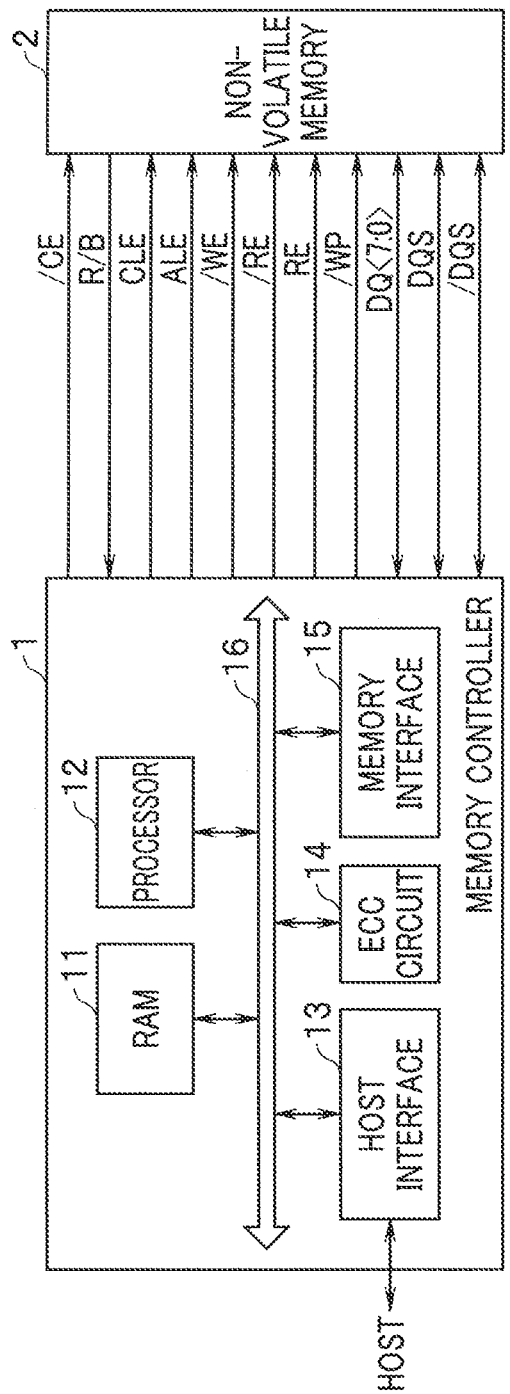
FIG. 1 is a block diagram of a memory system in the present embodiment.

FIG. 1 is a block diagram of a memory system. The memory system in the present embodiment includes a memory controller 1 and a non-volatile memory 2. The memory system is connected to a host. The host is an electronic device such as a personal computer or a portable terminal.

The non-volatile memory 2 is a semiconductor storage device configured to non-transitorily store data and includes, for example, a NAND flash memory. In the present embodiment, the non-volatile memory 2 is a NAND memory including a memory cell transistor MT capable of storing one bit per memory cell transistor MT, that is, a 1-bit/Cell (single level cell (SLC)) NAND memory, but is not limited thereto.

For example, the non-volatile memory 2 may be a NAND memory including a memory cell transistor MT capable of storing two bits or three bits per memory cell transistor MT, that is, a NAND memory including a multiple-value cell such as 2-bit/Cell (multiple level cell (MLC)) or 3-bit/Cell (triple level cell (TLC)). The non-volatile memory 2 has a three-dimensional structure.

The memory controller 1 and the non-volatile memory 2 are connected to each other through a NAND bus. The memory controller 1 controls data writing to the non-volatile memory 2 in accordance with a writing request from the host. The memory controller 1 also controls data reading from the non-volatile memory 2 in accordance with a reading request from the host. The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other through an internal bus 16.

The host interface 13 outputs a request received from the host, write data that is user data, and the like to the internal bus 16. The host interface 13 transmits user data read from the non-volatile memory 2, a response from the processor 12, and the like to the host.

The memory interface 15 controls writing and reading processing of user data and the like to and from the non-volatile memory 2 based on instructions from the processor 12.

The RAM 11 temporarily stores user data received from the host until storage in the non-volatile memory 2. The RAM 11 temporarily stores data read from the non-volatile memory 2 until transmission to the host. The RAM 11 is a general-purpose memory such as a static random access memory (SRAM) or a dynamic random access memory (DRAM).

The processor 12 collectively controls the memory controller 1. The processor 12 is, for example, a central processing unit (CPU) or a micro processing unit (MPU). When having received a request from the host through the host interface 13, the processor 12 performs control in accordance with the request. For example, in accordance with a request from the host, the processor 12 instructs the memory interface 15 to write user data to the non-volatile memory 2. In addition, in accordance with a request from the host, the processor 12 instructs the memory interface 15 to read user data from the non-volatile memory 2.

The processor 12 determines a storage region (hereinafter referred to as a memory region) on the non-volatile memory 2 for user data accumulated in the RAM 11. The user data is stored in the RAM 11 through the internal bus 16. The processor 12 performs the memory region determination for data per page as the unit of writing, that is, page data. In the present specification, unit data is defined to be user data stored in one page of the non-volatile memory 2. For example, unit data is encoded by the ECC circuit 14 and stored in the non-volatile memory 2 as a code word.

Note that encoding is not essential. The memory controller 1 may store unit data in the non-volatile memory 2 without encoding although FIG. 1 illustrates a configuration in which encoding is performed as a configuration example. When the memory controller 1 does not perform encoding, page data is identical to unit data. One code word may be generated based on one unit data, or one code word may be generated based on pieces of division data into which unit data is divided. Alternatively, one code word may be generated by using a plurality of pieces of unit data.

The processor 12 determines, for each unit data, a memory region on the non-volatile memory 2 at a writing destination. A physical address is allocated to each memory region on the non-volatile memory 2. The processor 12 manages a memory region at the writing destination of unit data by using the physical address. The processor 12 specifies the physical address of the determined memory region and instructs the memory interface 15 to write user data to the non-volatile memory 2. The processor 12 manages correspondence between a logical address (logical address managed by the host) of the user data and the physical address. When having received a reading request including a logical address from the host, the processor 12 specifies a physical address corresponding to the logical address and instructs the memory interface 15 to read user data with identification of the physical address.

The ECC circuit 14 generates a code word by encoding user data stored in the RAM 11. In addition, the ECC circuit 14 decodes a code word read from the non-volatile memory 2.

FIG. 1 illustrates a configuration example in which the memory controller 1 includes the ECC circuit 14 and the memory interface 15. However, the ECC circuit 14 may be built in the memory interface 15. Alternatively, the ECC circuit 14 may be built in the non-volatile memory 2.

When having received a writing request from the host, the memory controller 1 operates as follows. The processor 12 temporarily stores write data in the RAM 11. The processor 12 reads the data stored in the RAM 11 and inputs the read data to the ECC circuit 14. The ECC circuit 14 encodes the input data and provides a code word to the memory interface 15. The memory interface 15 writes the input code word to the non-volatile memory 2.

When having received a reading request from the host, the memory controller 1 operates as follows. The memory interface 15 provides, to the ECC circuit 14, a code word read from the non-volatile memory 2. The ECC circuit 14 decodes the input code word and stores decoded data in the RAM 11. The processor 12 transmits the data stored in the RAM 11 to the host through the host interface 13.

(Configuration of Non-Volatile Memory)

Figure 2:
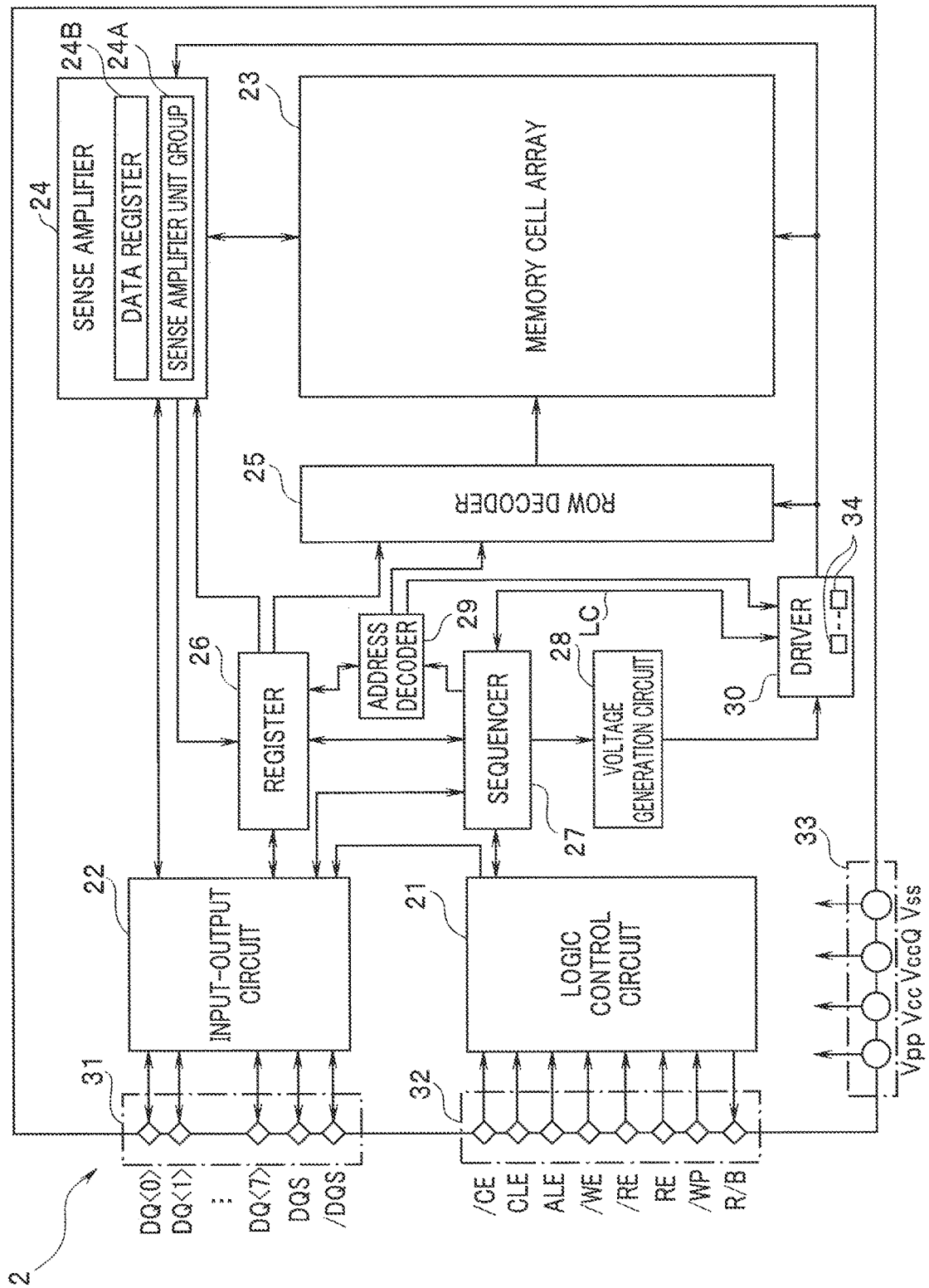
FIG. 2 is a block diagram of a non-volatile memory in the present embodiment.

FIG. 2 is a block diagram of the non-volatile memory 2. The non-volatile memory 2 includes a logic control circuit 21, an input-output circuit 22, a memory cell array 23, a sense amplifier 24, a row decoder 25, a register 26, a sequencer 27, a voltage generation circuit 28, an address decoder 29, a driver 30, an input-output pad group 31, a logic control pad group 32, and a power source inputting terminal group 33.

The logic control circuit 21 and the input-output circuit 22 are connected to the memory controller 1 through the NAND bus. The input-output circuit 22 transmits and receives signals DQ (for example, DQ0 to DQ7) to and from the memory controller 1 through the NAND bus.

The logic control circuit 21 receives external control signals (for example, a chip enable signal /CE, a command latch enable signal CLE, an address latch enable signal ALE, a write enable signal /WE, read enable signals RE and /RE, and a write protect signal /WP) from the memory controller 1 through the NAND bus. The logic control circuit 21 transmits a ready-busy signal R/B to the memory controller 1 through the NAND bus.

When having received an external control signal from the memory controller 1, the logic control circuit 21 outputs an internal control signal to the input-output circuit 22 in accordance with the external control signal.

In accordance with the internal control signal from the logic control circuit 21, the input-output circuit 22 outputs data input from the input-output pad group 31 to a data latch circuit XDL in the sense amplifier 24 and the register 26. The input-output circuit 22 also outputs data from a plurality of the data latch circuits XDL or the register 26 to the input-output pad group 31.

Figure 4:
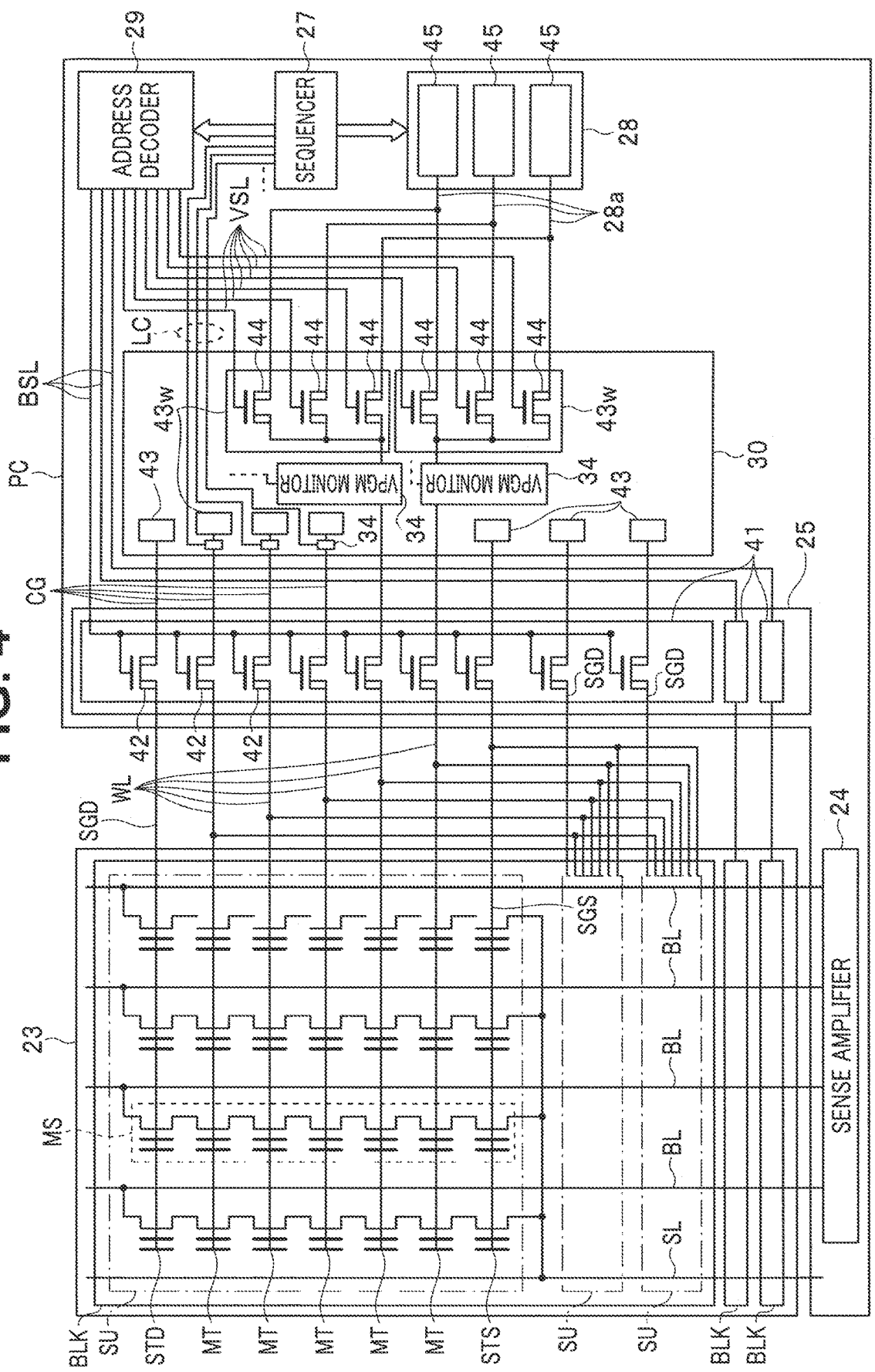
FIG. 4 is a circuit diagram of the non-volatile memory in the present embodiment.

The memory cell array 23 includes a plurality of memory cell transistors MT (FIG. 4). The memory cell array 23 includes a plurality of blocks (memory blocks) BLK as described later. Each of the plurality of blocks BLK includes a plurality of memory cell transistors (memory cell) MT. A plurality of bit lines, a plurality of word lines, a source line, and the like are disposed in the memory cell array 23 to control voltage applied to each memory cell transistor MT. A specific configuration of each block BLK will be described later.

The input-output pad group 31 includes a plurality of terminals (pads) corresponding to the signals DQ <7:0> and data strobe signals DQS and /DQS to transmit and receive signals including data to and from the memory controller 1.

The logic control pad group 32 includes a plurality of terminals (pads) corresponding to the chip enable signal /CE, the command latch enable signal CLE, the address latch enable signal ALE, the write enable signal /WE, the read enable signals RE and /RE, and the write protect signal /WP to transmit and receive signals to and from the memory controller 1. The symbol "/" attached to a signal name indicates active low.

The signal /CE enables selection of the non-volatile memory 2. The signal CLE enables latching of a command transmitted as a signal DQ at a command register. The signal ALE enables latching of an address transmitted as a signal DQ at an address register. The signal /WE enables writing. The signal RE enables reading. The signal /WP prohibits writing and erasure. The signal R/B indicates whether the non-volatile memory 2 is in a ready state (state in which a command from outside can be received) or a busy state (state in which a command from the outside cannot be received). The memory controller 1 can know the state of the non-volatile memory 2 by receiving the signal R/B.

To supply various kinds of operation power sources from the outside to the non-volatile memory 2, the power source inputting terminal group 33 includes a plurality of terminals through which power voltage Vcc, VccQ, and Vpp and ground voltage Vss are input. The power voltage Vcc is circuit power voltage typically provided from the outside as an operation power source and input as, for example, voltage of 3.3 V approximately. The power voltage VccQ is input as, for example, voltage of 1.2 V. The power voltage VccQ is used when signals are transmitted and received between the memory controller 1 and the non-volatile memory 2. The power voltage Vpp is power voltage higher than the power voltage Vcc and input as, for example, voltage of 12 V.

The sense amplifier 24 receives a column address from the register 26 and decodes the column address. The sense amplifier 24 selects either bit line BL (FIG. 4) based on the decoded column address. At data reading, the sense amplifier 24 senses and amplifies data read from a memory cell transistor MT to a bit line BL. At data writing, the sense amplifier 24 forwards write data to a bit line BL.

The sense amplifier 24 includes a sense amplifier unit group 24A and a data register 24B. The sense amplifier unit group 24A includes a plurality of sense amplifier units SAU corresponding to a plurality of bit lines BL.

Figure 3:
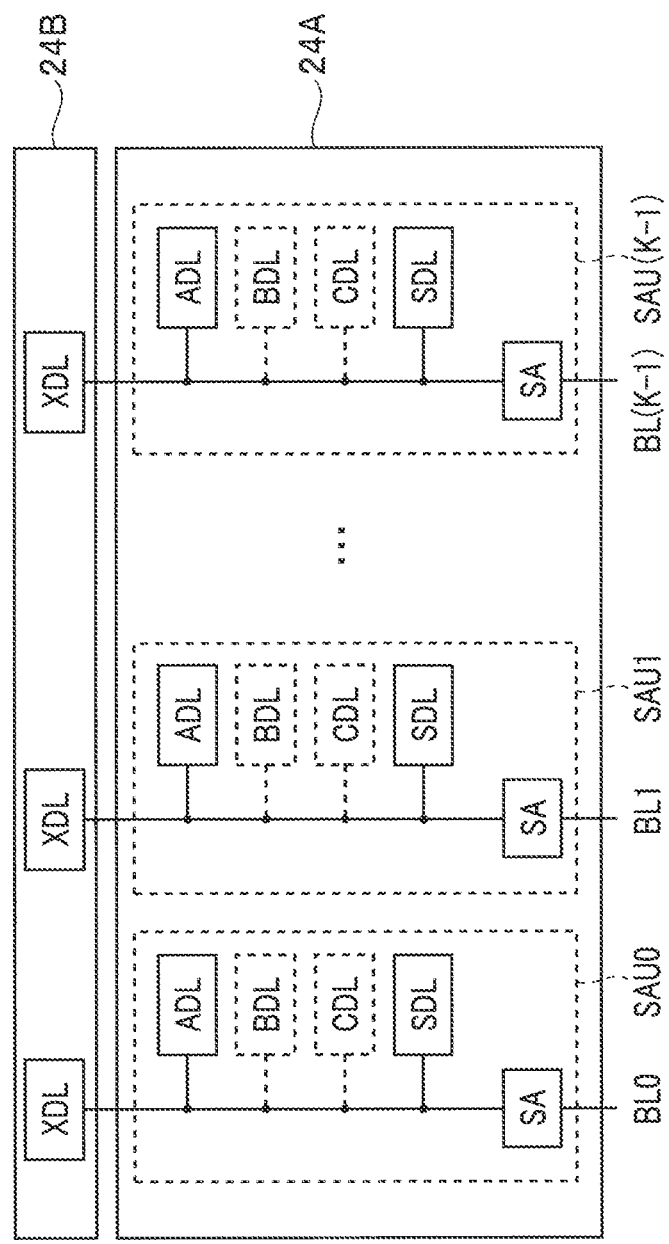
FIG. 3 is a block diagram of a sense amplifier in the present embodiment.

FIG. 3 is a block diagram of the sense amplifier 24. FIG. 3 illustrates a case in which each memory cell transistor MT is a single level cell (SLC). As illustrated in FIG. 3, the sense amplifier 24 includes a plurality of sense amplifier units SAU (SAU0 to SAU(K−1)) provided for the respective bit lines BL.

The plurality of sense amplifier units SAU each include a sense amplifier section SA and two data latch circuits (hereinafter also simply referred to as data latch) ADL and SDL. The data latch circuit ADL temporarily stores write data. Thus, the data latch circuit ADL is used for data writing to the non-volatile memory 2 by the memory controller 1.

The data register 24B includes a plurality of data latch circuits XDL.

The sense amplifier section SA and the data latch circuits ADL and SDL are connected to each other through a bus to transmit and receive data to and from each other. The bus is further connected to a corresponding data latch circuit XDL.

The sense amplifier 24 includes the plurality of data latch circuits ADL, XDL, and SDL each configured to store one page of data.

Note that when each memory cell transistor MT is a multiple-value cell, for example, a triple level cell (TLC), the data latch circuits also include data latch circuits BDL and CDL as illustrated with a dotted line in addition to the data latch circuit ADL. In this case, the data latch circuits ADL, BDL, and CDL are used for multiple-value operation that each memory cell transistor MT stores two bits or more of data. Specifically, the data latch circuit ADL is used to store a lower-level page. The data latch circuit BDL is used to store an intermediate-level page. The data latch circuit CDL is used to store a higher-level page. Note that the number of data latch circuits included in each sense amplifier unit SAU is optionally changeable in accordance with the number of bits stored by one memory cell transistor MT.

In reading operation, the sense amplifier section SA senses data read to a corresponding bit line BL and determines whether the data is "0" data or "1" data. In writing operation, the sense amplifier section SA applies voltage to a bit line BL based on write data.

At data reading, the data register 24B temporarily stores data detected by the sense amplifier 24 and serially forwards the data to the input-output circuit 22. At data writing, the data register 24B temporarily stores data serially forwarded from the input-output circuit 22 and forwards the data to the sense amplifier 24. The data register 24B is configured as an SRAM or the like.

The data register 24B includes data latch circuits XDL in a number corresponding to the number of the plurality of sense amplifier units SAU. The data latch circuits XDL are connected to the input-output circuit 22. Each data latch circuit XDL is a circuit used for data forwarding between the sense amplifier 24 and the outside, temporarily stores data transmitted from the input-output circuit 22, and temporarily stores read data transmitted from a corresponding sense amplifier unit SAU. More specifically, data forwarding between the input-output circuit 22 and each of the plurality of sense amplifier units SAU is performed through a plurality of data latch circuits XDL for one page. Write data received by the input-output circuit 22 is forwarded to a data latch circuit ADL through a corresponding data latch circuit XDL. Read data obtained by a sense amplifier section SA is forwarded to the input-output circuit 22 through a corresponding data latch circuit XDL.

The row decoder 25 receives a row address from the register 26 and decodes the row address. The row decoder 25 performs word line selection operation based on the decoded row address. Then, the row decoder 25 forwards a plurality of voltages necessary for writing operation, reading operation, and erasure operation to a selected block.

The register 26 includes a command register, an address register, and a status register. The command register temporarily stores a command. The address register temporarily stores an address. The status register temporarily stores data necessary for operation of the non-volatile memory 2. The register 26 is configured as, for example, an SRAM.

The sequencer 27 as a control circuit receives a command from the register 26 and controls the non-volatile memory 2 in accordance with a sequence based on the command.

The voltage generation circuit 28 receives power voltage from the outside of the non-volatile memory 2 and generates, by using the power voltage, a plurality of voltages necessary for writing operation, reading operation, and erasure operation. The voltage generation circuit 28 supplies the generated voltages to the memory cell array 23, the sense amplifier 24, the row decoder 25, and the like through the driver 30.

The address decoder 29 sequentially refers to address data in the register 26 in accordance with a control signal from the sequencer 27, decodes the address data, and controls states of a plurality of signal lines corresponding to the address data. In this example, the address decoder 29 sets a voltage selection line corresponding to the address data to an "H" state, and sets other block selection lines BSL (FIG. 4) and voltage selection lines VSL (FIG. 4) to an "L" state.

The driver 30 generates various voltage signals based on a block address BA and a page address PA in the register 26 and supplies various voltages to a selected block BLK through the row decoder 25.

The driver 30 includes a plurality of VPGM monitors 34. Each VPGM monitor 34 is provided to a global word line. Each VPGM monitor 34 is a voltage detection circuit connected to a word line WL and configured to detect voltage of the word line WL. The global word line is a word line through which a signal is supplied to the plurality of blocks BLK. Each VPGM monitor 34 is a detection circuit configured to detect writing program voltage VPGM supplied to a corresponding word line WL in accordance with a control signal from the sequencer 27. Each VPGM monitor 34 may be a circuit configured to compare analog voltages or may be a circuit configured to convert voltages into digital values and compare digital values. Each VPGM monitor 34 can output a detected voltage value to the sequencer 27 under control of the sequencer 27.

FIG. 4 is a circuit diagram of the non-volatile memory 2.

The memory cell array 23 includes a plurality (in FIG. 4, three) of blocks BLK as described above. Each block BLK of the memory cell array 23 includes a plurality (in FIG. 4, three) of string units SU. Although FIG. 4 illustrates only a configuration of one string unit SU, the other string units SU have the same configuration. Each string unit SU includes a plurality of memory strings MS (in FIG. 4, four). In this example, each memory string MS is a NAND string. One end of each memory string MS is connected to a peripheral circuit PC through a corresponding bit line BL. The other end of each memory string MS is connected to the peripheral circuit PC through a common source line SL. Note that although FIG. 4 illustrates only a configuration of one block BLK, the other blocks BLK have the same configuration.

Each memory string MS includes a drain selection transistor STD, a plurality of memory cell transistors MT, and a source selection transistor STS, which are connected in series between a corresponding bit line BL and the source line SL. Hereinafter, each of the drain selection transistor STD and the source selection transistor STS is also simply referred to as a selection transistor.

Each memory cell transistor MT is a field-effect transistor including a semiconductor layer that functions as a channel region, a gate insulating film including an electric charge accumulation film, and a gate electrode. A threshold voltage of the memory cell transistor MT changes in accordance with an amount of electric charge in the electric charge accumulation film. The memory cell transistor MT can store one bit or a plurality of bits of data. A word line WL is connected to the gate electrode of each memory cell transistor MT. In each block BLK, each word line WL is common to the plurality of string units SU. In other words, each of the plurality of word lines WL is connected in common to all string units SU in one block BLK.

The selection transistors STD and STS are each a field-effect transistor including a semiconductor layer that functions as a channel region, a gate insulating film, and a gate electrode. The gate electrode of the drain selection transistor STD is connected to a drain select gate line SGD. The gate electrode of the source selection transistor STS is connected to a source select gate line SGS. Each drain select gate line SGD is provided for a corresponding string unit SU. Each drain select gate line SGD is connected in common to all memory strings MS in one string unit SU. The source select gate line SGS is connected in common to all memory strings MS in one block BLK.

The peripheral circuit PC includes the sense amplifier 24, the row decoder 25, the register 26 (FIG. 2), the sequencer 27, the voltage generation circuit 28, the address decoder 29, and the driver 30.

The row decoder 25 includes a plurality of block selection circuits 41 corresponding to the plurality of blocks BLK. Each block selection circuit 41 includes a plurality of block selection transistors 42. Note that although FIG. 4 illustrates only a configuration of a block selection circuit 41 corresponding to one block BLK, the other block selection circuits 41 have the same circuit configuration. The plurality of block selection transistors 42 are each provided for a corresponding one of a plurality of respective drain select gate lines SGD, a plurality (in FIG. 4, five) of respective word lines WL, and the source select gate line SGS.

Each block selection transistor 42 is a field-effect high breakdown voltage transistor. One end of each block selection transistor 42 is electrically connected to a corresponding drain select gate line SGD, a corresponding word line WL, or the source select gate line SGS. The other end of each block selection transistor 42 is electrically connected to a corresponding wire CG. A gate electrode of each block selection transistor 42 in one block selection circuit 41 is connected in common to a corresponding block selection line BSL extending from the address decoder 29.

The driver 30 includes a plurality of voltage selection circuits 43 and 43w. As illustrated in FIG. 4, the driver 30 includes a plurality of voltage selection circuits 43 corresponding to the plurality of select gate lines SGD. The driver 30 includes a plurality of voltage selection circuits 43w corresponding to the plurality of word lines WL. In addition, the driver 30 includes a voltage selection circuit 43 corresponding to the select gate line SGS.

The voltage selection circuits 43 and 43w each include a plurality (in this example, three) of voltage selection transistors 44. Note that although FIG. 4 illustrates only circuit configurations of two voltage selection circuits 43w, circuit configurations of the other voltage selection circuits 43 and 43w are same. Each voltage selection transistor 44 is a field-effect high breakdown voltage transistor.

One end of each voltage selection transistor 44 in each voltage selection circuit 43 is connected to a wire CG. One end of each voltage selection transistor 44 in each voltage selection circuit 43w is connected to a wire CG through a VPGM monitor 34.

Accordingly, one end of each voltage selection transistor 44 is electrically connected to a corresponding word line WL or select gate line SGD or SGS through a corresponding wire CG and a corresponding block selection transistor 42.

The other end of each voltage selection transistor 44 is connected to a corresponding operation voltage generation unit 45. As illustrated in FIG. 4, the other end of each voltage selection transistor 44 is electrically connected to a corresponding operation voltage output terminal 28a.

A gate electrode of each voltage selection transistor 44 is connected to a corresponding voltage selection line VSL.

The voltage generation circuit 28 includes a plurality (in this example, three) of operation voltage generation units 45. Each operation voltage generation unit 45 is connected to, for example, a supply terminal of the power voltage Vcc or Vss. The operation voltage generation units 45 are circuits configured to sequentially generate, in accordance with a control signal from the sequencer 27, operation voltages to be applied to the source line SL, the word lines WL, and the select gate lines SGD and SGS, and output the operation voltages to a plurality of operation voltage output terminals 28a in reading operation, writing operation, and erasure operation on the memory cell array 23.

Although not illustrated, the operation voltage generation units 45 also sequentially generate operation voltages to be applied to the bit lines BL, and output the operation voltages to the bit lines BL in accordance with a control signal from the sequencer 27.

A plurality of block selection lines BSL and a plurality of voltage selection lines VSL are connected to the address decoder 29. In accordance with a control signal from the sequencer 27, the address decoder 29 sequentially refers to address data in the register 26, decodes the address data, sets some of the plurality of block selection lines BSL and the plurality of voltage selection lines VSL, which correspond to the address data, to the "H" state, and sets the rest of the plurality of block selection lines BSL and the plurality of voltage selection lines VSL to the "L" state.

The sequencer 27 sequentially decodes commands stored in the register 26 and outputs internal control signals to the sense amplifier 24, the row decoder 25, the driver 30, and the voltage generation circuit 28.

In addition, the sequencer 27 outputs status data indicating a state of the sequencer 27 to the register 26 as appropriate. For example, at execution of a writing sequence or an erasure sequence, information indicating whether the writing sequence or the erasure sequence has normally ended is output as the status data.

(Operation)

Subsequently, operation of the memory system in the present embodiment will be described below.

When data is to be written, each voltage selection transistor 44 of the driver 30 is turned on or off in accordance with a control signal from the sequencer 27. Predetermined voltage is applied to each of the word lines WL and the select gate lines SGD and SGS when the voltage selection transistors 44 are turned on and off.

For example, predetermined program voltage VPGM is applied to a word line WL selected as a data writing target (hereinafter referred to as a selected word line WLs).

Figure 5:
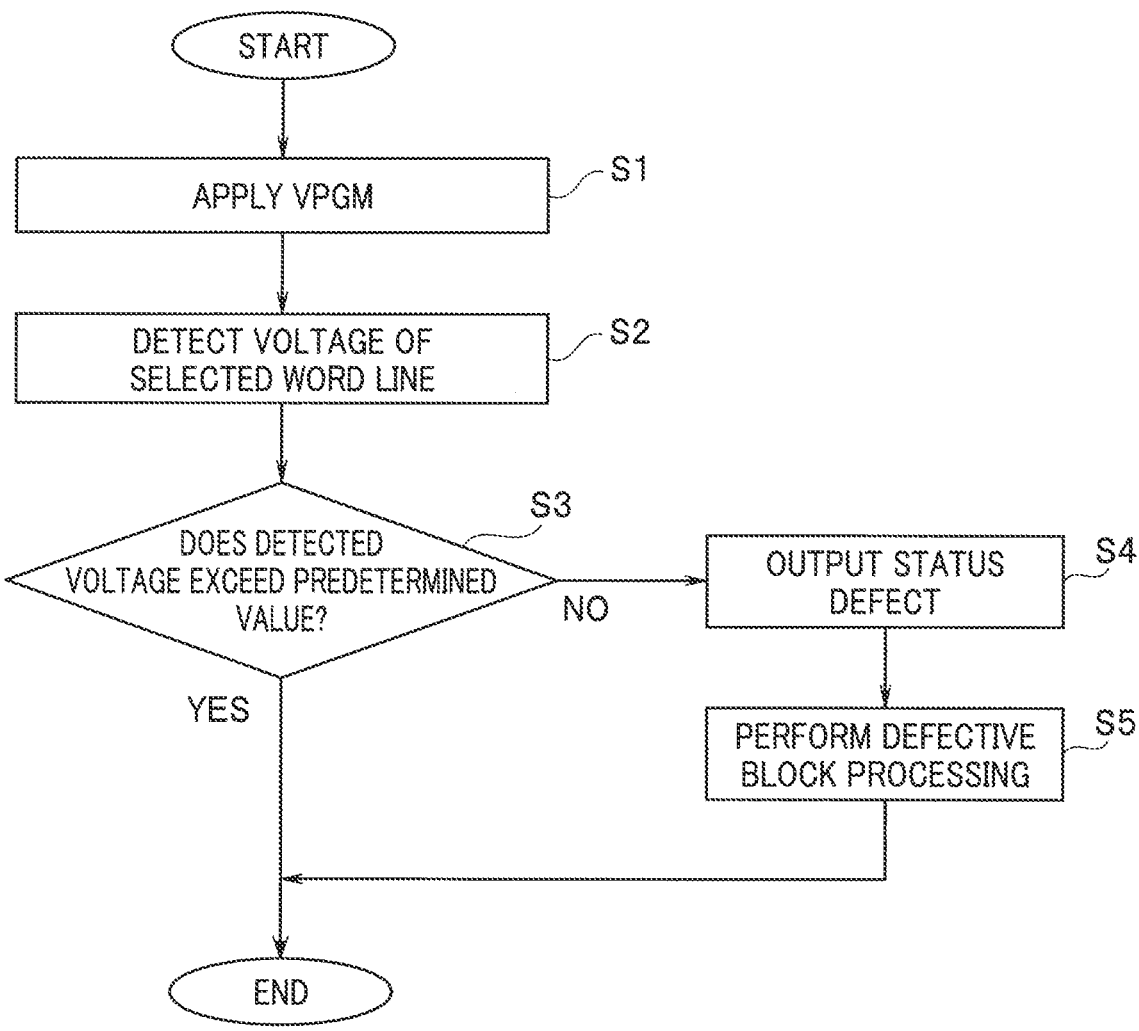
FIG. 5 is a flowchart illustrating writing operation in the present embodiment.
Figure 6:
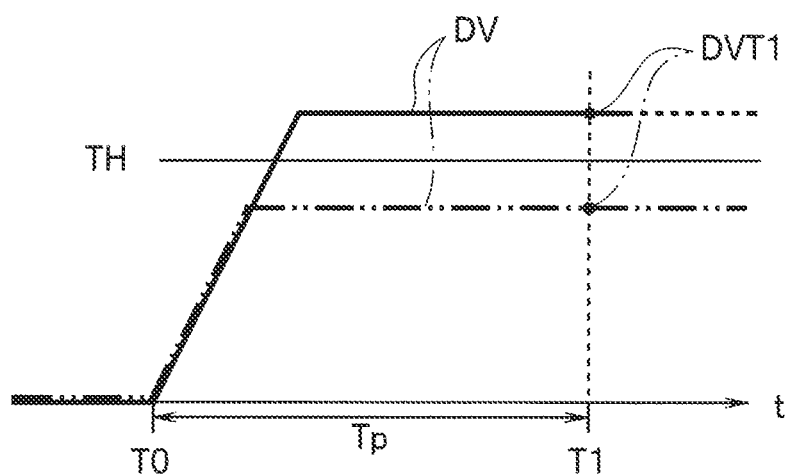
FIG. 6 is a graph illustrating voltage of a selected word line and detected voltage in the present embodiment.

FIG. 5 is a flowchart illustrating writing operation processing. FIG. 6 is a graph illustrating voltage of the selected word line WLs and detected voltage DVT1 detected by a corresponding VPGM monitor 34 when the program voltage VPGM is applied.

At step S1, the predetermined program voltage VPGM is applied to the selected word line WLs. Actual voltage applied to the selected word line WLs is referred to as voltage DV.

At step S2, the voltage of the selected word line WLs when a certain time has elapsed since the application of the program voltage VPGM is detected. The sequencer 27 controls the VPGM monitor 34 provided to the selected word line WLs through a control signal line LC and detects the voltage of the selected word line WLs after the application of the program voltage VPGM. As illustrated in FIG. 6, the sequencer 27 detects the voltage of the selected word line WLs and sets the voltage detected as the detected voltage DVT1 at detection timing T1 when a predetermined time Tp has elapsed since a timing T0 of the application of the program voltage VPGM. The predetermined time Tp is set in advance. In the present embodiment, the number of times of detection of the voltage of the selected word line WLs is once.

At step S3, it is determined whether the detected voltage DVT1 detected by the VPGM monitor 34 exceeds a predetermined value TH. The predetermined value TH is set in advance and written in a predetermined storage region of the non-volatile memory 2. The sequencer 27 reads the predetermined value TH in advance.

The predetermined value TH is a voltage value set in advance so that a desired amount of electric charge is accumulated at each memory cell transistor MT when voltage exceeding the predetermined value TH is applied to the selected word line WLs.

When the detected voltage DVT1 exceeds the predetermined value TH (YES at S3), the sequencer 27 ends the processing in FIG. 5.

When the detected voltage DVT1 does not exceed the predetermined value TH (NO at S3), a status defect is output to the memory controller 1 at step S4. Specifically, the sequencer 27 writes status data indicating a program status defect to the register 26.

After step S3, defective block processing is executed at step S5. The defective block processing is processing to handle, as a defective block thereafter, a block including the selected word line WLs to which the program voltage VPGM is applied at step S1.

After step S5, the sequencer 27 ends the writing processing in FIG. 5.

Note that although the processing at S1 to S5 is executed by the sequencer 27 in this example, the entire or part of the processing at S1 to S5 may be executed by a circuit different from the sequencer 27.

Step S3 will be described in more detail below with reference to FIG. 6. In FIG. 6, when the voltage DV of the selected word line WLs changes as illustrated with a solid line, the detected voltage DVT1 exceeds the predetermined value TH (YES at S3) and thus the sequencer 27 ends the writing processing in FIG. 5.

In FIG. 6, when the voltage DV of the selected word line WLs changes as illustrated with a dashed and double-dotted line, the detected voltage DVT1 does not exceed the predetermined value TH (NO at S3) and thus the sequencer 27 notifies the memory controller 1 of a status defect (S4), executes the defective block processing, and ends the writing processing illustrated in FIG. 5.

Note that each VPGM monitor 34 is provided to the global word line in a corresponding word line WL in the above-described example, but may be provided to a local word line in the corresponding word line WL. The local word line is a word line corresponding to a block BLK.

Figure 7:
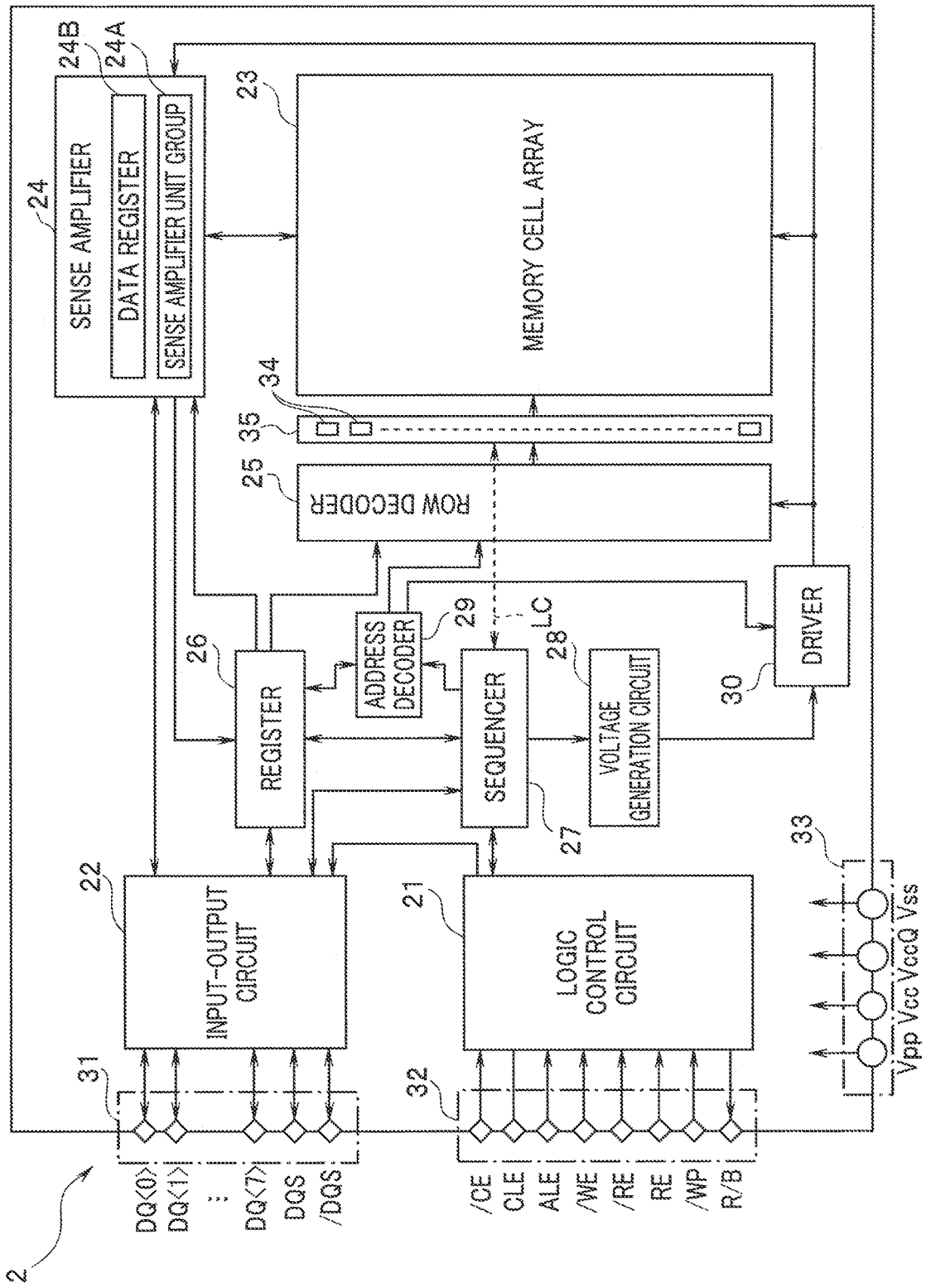
FIG. 7 is a block diagram of a non-volatile memory of another example of the present embodiment.
Figure 8:
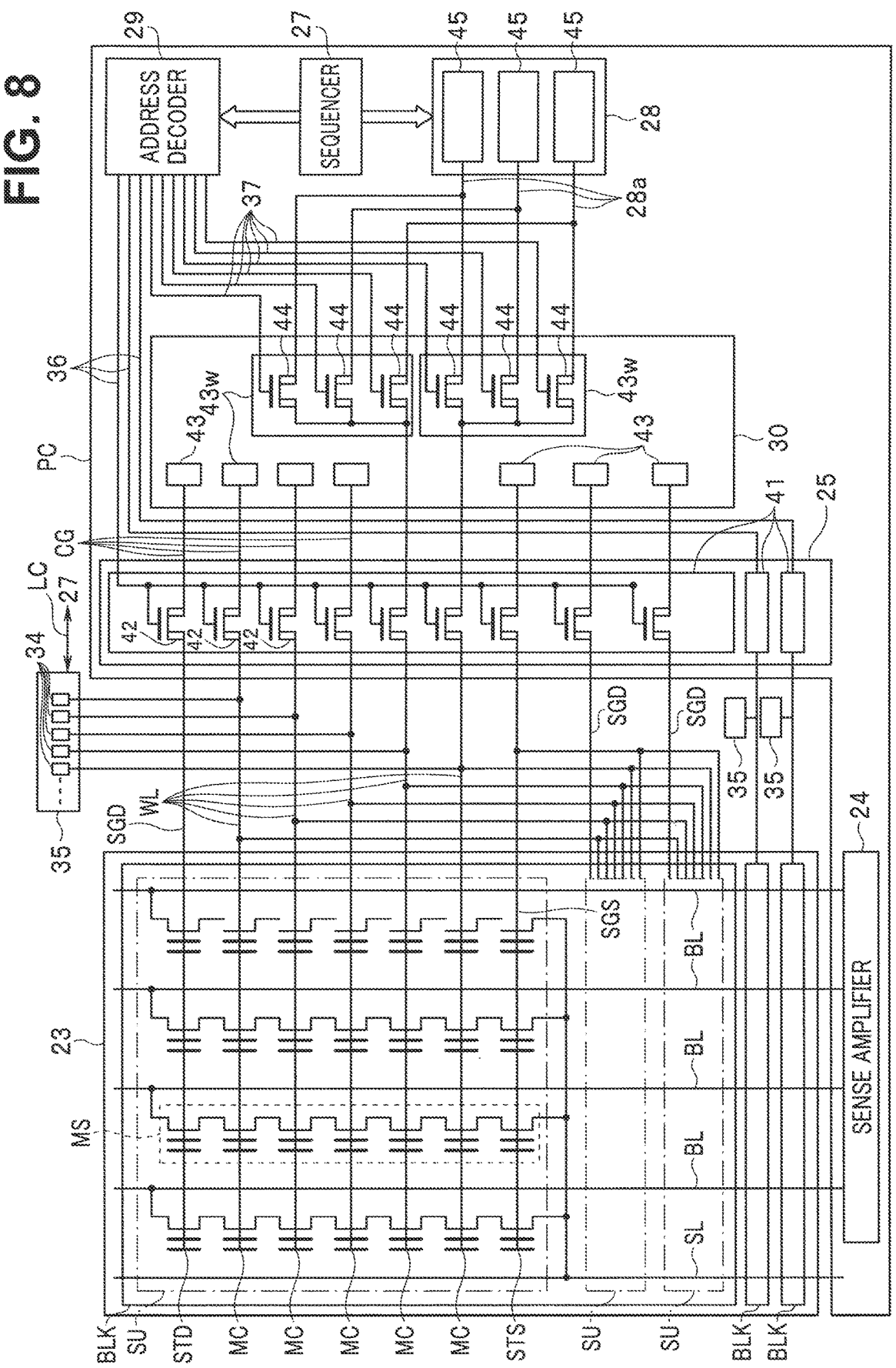
FIG. 8 is a circuit diagram of the non-volatile memory of the other example of the present embodiment.

FIG. 7 is a block diagram of the non-volatile memory 2 of another example of the present embodiment. FIG. 8 is a circuit diagram of the non-volatile memory 2 of the other example of the present embodiment. In FIGS. 7 and 8, any component same as that in FIGS. 2 and 4 is denoted by the same reference sign. In FIGS. 7 and 8, a VPGM monitor 34 in FIG. 4 is provided to each local word line in each block BLK. In FIG. 7, the plurality of VPGM monitors 34 are provided between the memory cell array 23 and the row decoder 25 and illustrated as a VPGM monitor section 35.

The VPGM monitors 34 are provided to local word lines WL between the row decoder 25 and the memory cell array 23. Specifically, each VPGM monitor 34 is provided to a corresponding local word line WL.

Each VPGM monitor 34 is controlled by the sequencer 27 through the control signal line LC and outputs detected voltage to the sequencer 27.

The sequencer 27 can obtain the detected voltage DVT1 by controlling a VPGM monitor 34 corresponding to the selected word line WLs. Processing at the sequencer 27 is same as in FIG. 5.

Thus, according to the present embodiment, data writing can be performed at high speed in the memory system because verify operation is not executed in writing operation. As a result, according to the present embodiment, it is possible to provide a semiconductor storage device having improved writing performance.

(Modification 1)

Each memory cell transistor MT is an SLC that can store one bit of data in the above-described embodiment but may be a multiple-value cell that can store two bits or more of data. When each memory cell transistor MT is a multiple-value cell, a plurality of predetermined values are compared with the detected voltage DVT1.

Figure 9:
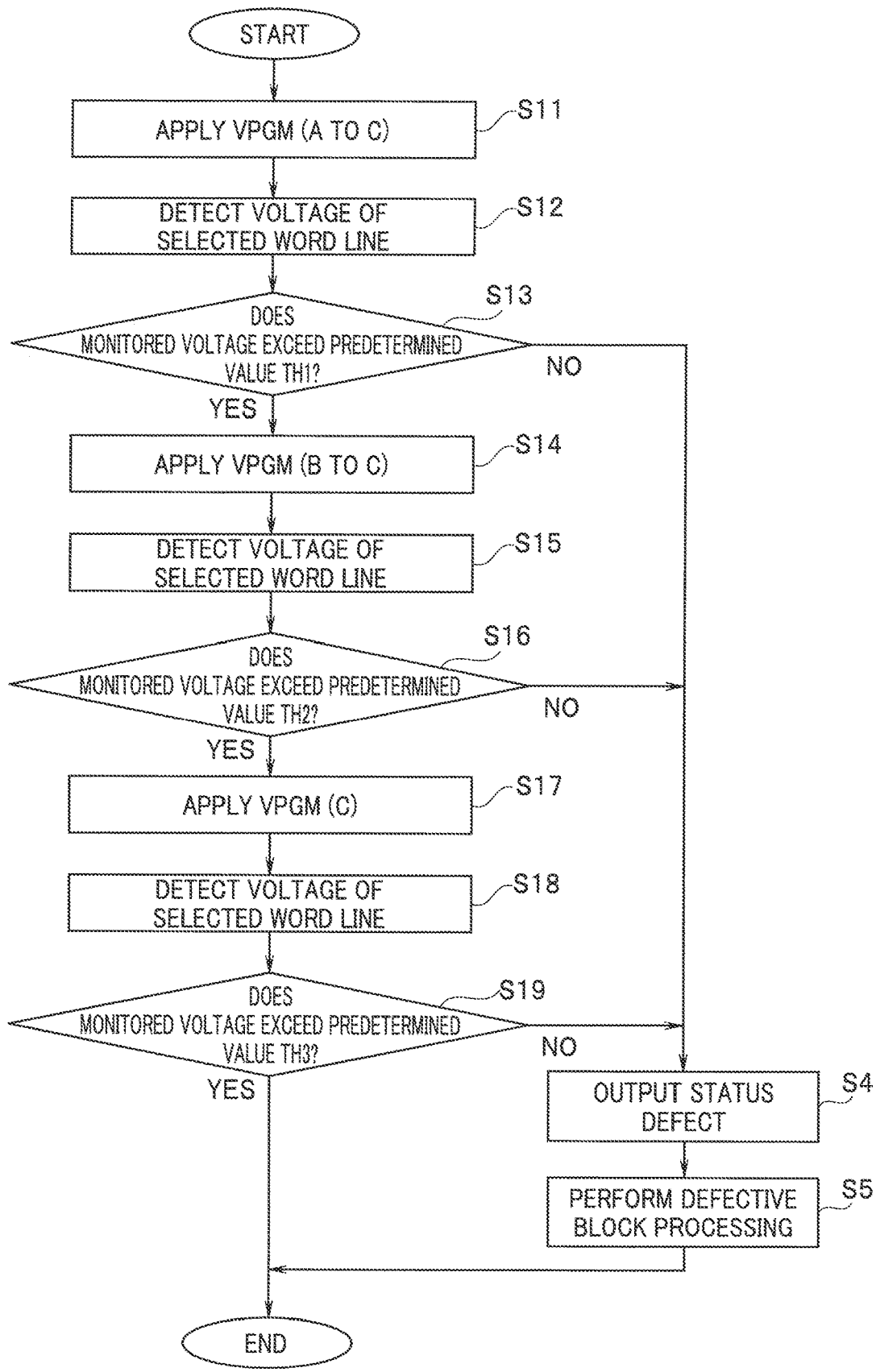
FIG. 9 is a flowchart illustrating writing operation in Modification 1 of the present embodiment.

FIG. 9 is a flowchart illustrating writing operation processing in Modification 1.

In this example, each memory cell transistor MT is an MLC that can store two bits of data. Each memory cell transistor MT, which is an MLC, can have four states. Thus, three predetermined values are provided. The four states are Er, A, B, and C, and the predetermined values are first to third predetermined values TH1 to TH3.

At step S11, predetermined program voltage VPGM (A to C) is applied to the selected word line WLs. The predetermined program voltage VPGM (A to C) is, for example, voltage with which the threshold voltage of each memory cell transistor MT becomes equal to or higher than voltage VA between states Er and A.

At step S12, the voltage of the selected word line WLs after the application of the program voltage VPGM is detected. The sequencer 27 detects the voltage of the selected word line WLs after the application of the program voltage VPGM by controlling the VPGM monitor 34 provided to the selected word line WLs through the control signal line LC.

At step S13, it is determined whether the detected voltage DVT1 detected by the VPGM monitor 34 exceeds the predetermined value TH1. The predetermined value TH1 is voltage set in advance so that a predetermined amount of electric charge corresponding to state A is accumulated at each memory cell transistor MT when voltage exceeding the predetermined value TH1 is applied to the selected word line WLs. "TH1" can be substituted into "TH" in FIG. 6.

When the detected voltage DVT1 exceeds the predetermined value TH1 (YES at S13), predetermined program voltage VPGM (B to C) is applied to the selected word line WLs at step S14. The predetermined program voltage VPGM (B to C) is, for example, voltage with which the threshold voltage of each memory cell transistor MT becomes equal to or higher than voltage VB between states A and B.

When the detected voltage DVT1 does not exceed the predetermined value TH1 (NO at S13), a status defect is output to the memory controller 1 at step S4. After step S4, the defective block processing is executed at step S5.

After S5, the sequencer 27 ends the writing processing in FIG. 9.

After step S4, the voltage of the selected word line WLs after the application of the program voltage VPGM (B) is detected at step S15. The sequencer 27 detects the voltage of the selected word line WLs after the application of the program voltage VPGM (B) by controlling the VPGM monitor 34 provided to the selected word line WLs through the control signal line LC.

At step S16, it is determined whether the detected voltage DVT1 detected by the VPGM monitor 34 exceeds the predetermined value TH2. The predetermined value TH2 is voltage set in advance so that a predetermined amount of electric charge corresponding to state B is accumulated at each memory cell transistor MT when voltage exceeding the predetermined value TH2 is applied to the selected word line WLs. "TH2" can be substituted into "TH" in FIG. 6.

When the detected voltage DVT1 exceeds the predetermined value TH2 (YES at S16), predetermined program voltage VPGM (C) is applied to the selected word line WLs at step S17. The predetermined program voltage VPGM (C) is, for example, voltage with which the threshold voltage of each memory cell transistor MT becomes equal to or higher than voltage VC between states B and C.

When the detected voltage DVT1 does not exceed the predetermined value TH2 (NO at S16), the sequencer 27 executes the processing at steps S4 and S5. After step S5, the sequencer 27 ends the writing processing in FIG. 9.

After step S17, the voltage of the selected word line WLs after the application of the program voltage VPGM (C) is detected at step S18. The sequencer 27 detects the voltage of the selected word line WLs after the application of the program voltage VPGM (C) by controlling the VPGM monitor 34 provided to the selected word line WLs through the control signal line LC.

At step S19, it is determined whether the detected voltage DVT1 detected by the VPGM monitor 34 exceeds the predetermined value TH3. The predetermined value TH3 is voltage set in advance so that a predetermined amount of electric charge corresponding to state C is accumulated at each memory cell transistor MT when voltage exceeding the predetermined value TH3 is applied to the selected word line WLs. "TH3" can be substituted into "TH" in FIG. 6.

When the detected voltage DVT1 exceeds the predetermined value TH3 (YES at S19), the sequencer 27 ends the processing in FIG. 9.

When the detected voltage DVT1 does not exceed the predetermined value TH3 (NO at S19), the sequencer 27 executes the processing at steps S4 and S5. After step S5, the sequencer 27 ends the writing processing in FIG. 9.

As described above, when a plurality of memory cell transistor MT are each a multiple-value cell that can store a plurality of bits of data, a plurality of predetermined values are provided to distinguish the plurality of bits of data, and the sequencer 27 determines whether the detected voltage DVT1 has reached each of the plurality of predetermined values.

Although each memory cell transistor MT can store two bits of data in the above-described example, the present embodiment is also applicable when each memory cell transistor MT is, for example, a TLC, a QLC, or a PLC that can store three bits or more of data.

(Modification 2)

In the above-described embodiment, whether writing in a writing operation has been successful is determined by detecting the voltage of the selected word line WLs without a verify operation after a program operation, but the writing operation may include a verify operation.

Figure 10:
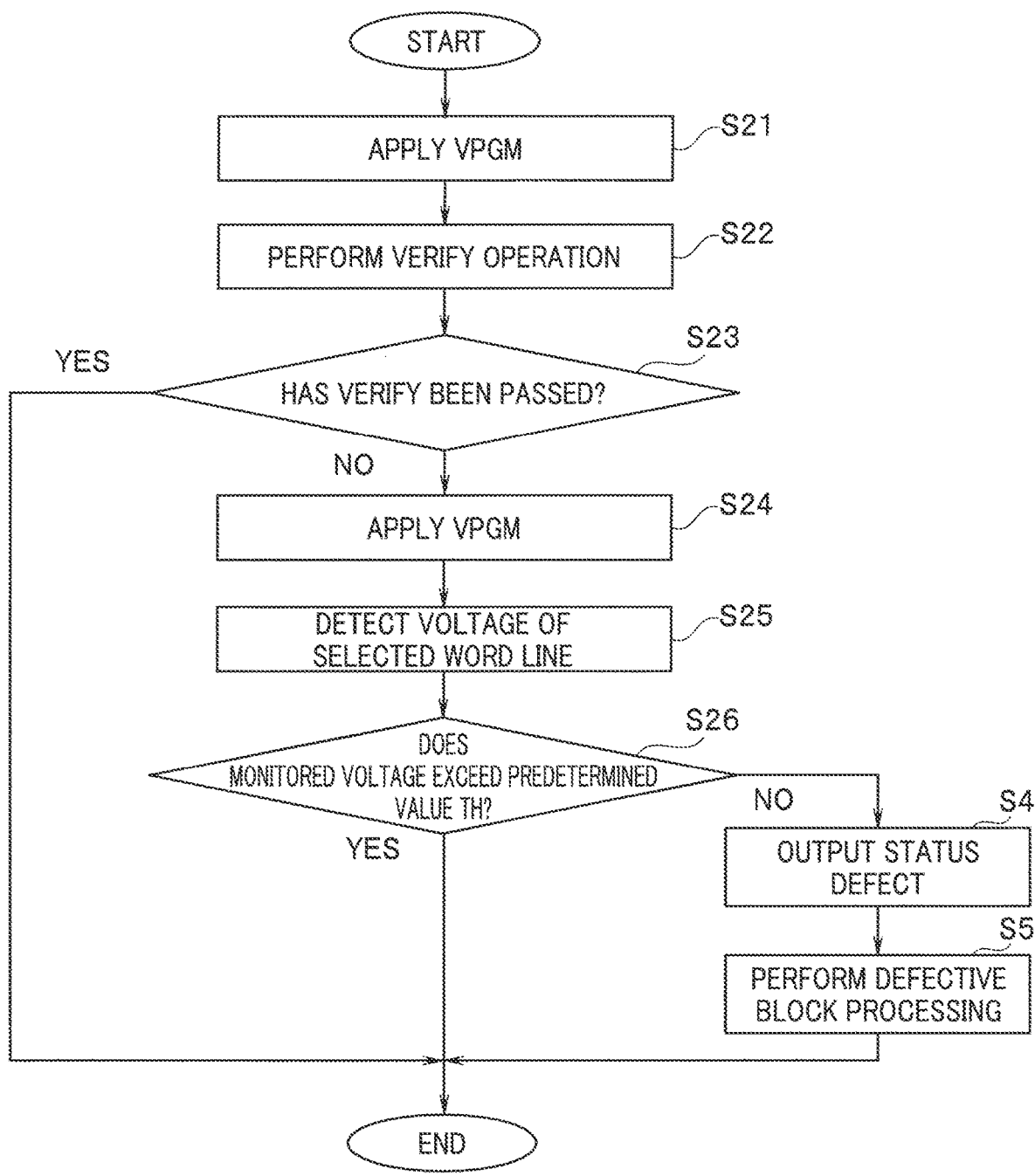
FIG. 10 is a flowchart illustrating writing operation in Modification 2 of the present embodiment.

FIG. 10 is a flowchart illustrating writing operation at the sequencer 27 according to Modification 2.

At step S21, the predetermined program voltage VPGM is applied to the selected word line WLs.

At step S22, verify operation is executed on written data.

At step S23, it is determined whether a selected memory cell transistor MT has reached a verify level as a result of the verify operation, that is, whether verify has been passed. It is meant that data has been written to the selected memory cell transistor MT when the selected memory cell transistor MT has reached the verify level.

Thus, when verify has been passed (YES at S23), the sequencer 27 ends the processing.

When verify has not been passed (NO at S23), the predetermined program voltage VPGM is applied to the selected word line WLs again at step S24.

At step S25, the voltage of the selected word line WLs after the application of the program voltage VPGM is detected. The sequencer 27 detects the voltage of the selected word line WLs after the application of the program voltage VPGM by controlling the VPGM monitor 34 (or 35) provided to the selected word line WLs.

The sequencer 27 determines whether the detected voltage DVT1 detected by the VPGM monitor 34 exceeds the predetermined value TH (S26).

When the detected voltage DVT1 exceeds the predetermined value TH (YES at S26), the sequencer 27 ends the writing processing in FIG. 10.

When the detected voltage DVT1 does not exceed the predetermined value TH (NO at S26), a status defect is output to the memory controller 1 at step S4 and the defective block processing is executed at step S5.

Thus, according to Modification 2, in a writing operation, a verify operation is performed after initial VPGM application, and when verify has not been passed, a writing state is determined based on the detected voltage DVT1 of the VPGM monitor 34. It may be determined that writing has been successful when verify has not been passed but the detected voltage DVT1 is higher than the predetermined value TH.

Note that when VPGM application is performed a plurality of times in a program sequence, verify operation may be performed in a case of initial VPGM application, and the writing state may be determined based on the detected voltage DVT1 of the VPGM monitor 34 in a case of last VPGM application.

(Modification 3)

Setting of a predetermined time at which the voltage of the selected word line WLs is detected may be changeable.

Figure 11:
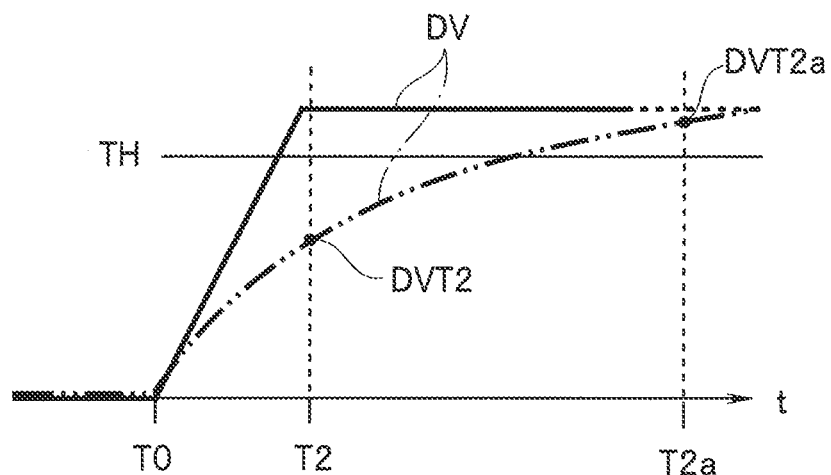
FIG. 11 is a graph illustrating the voltage of the selected word line and voltage detection timings in Modification 3 of the present embodiment.

FIG. 11 is a graph illustrating change in the voltage of the selected word line WLs in Modification 3.

As illustrated with a dashed and double-dotted line in FIG. 11, change in the voltage DV of the selected word line WLs after the application of the program voltage VPGM is gradual in some cases. In such a case, detected voltage DVT2 of the selected word line WLs has not reached the predetermined value TH at detection time T2 in FIG. 11. In Modification 3, setting of a time at which the sequencer 27 detects the voltage DV of the selected word line WLs through the VPGM monitor 34 is changeable. Thus, the voltage detection time can be delayed so that detected voltage DVT2a of the selected word line WLs is detected at detection time T2a in FIG. 11. The voltage detection time is set in accordance with characteristics of the semiconductor storage device.

The number of times of detection of the voltage DV of the selected word line WLs is once in the above-described embodiment and Modification 3, but may be a plurality of times.

Figure 12:
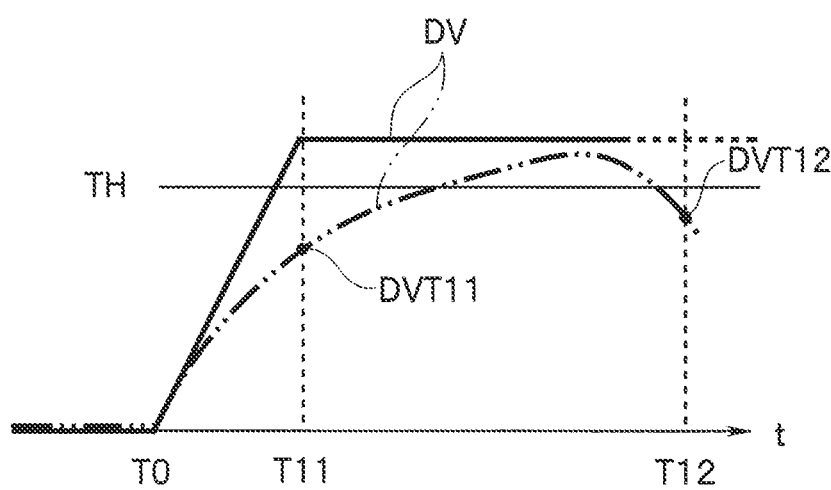
FIG. 12 is a graph illustrating the voltage of the selected word line and voltage detection timings in Modification 4 of the present embodiment.

FIG. 12 is a graph illustrating change in the voltage of the selected word line WLs and voltage detection timings in Modification 4.

In FIG. 12, two voltage detection times are provided. As illustrated with a dashed and double-dotted line, the voltage DV of the selected word line WLs temporarily increases and thereafter decreases in some cases. In FIG. 12, detected voltage DVT11 and detected voltage DVT12 of the selected word line WLs are detected twice at first detection time T11 and detection time T12 thereafter. The two detection times are set in accordance with characteristics of the selected word line WLs. In Modification 4, the number of times that the sequencer 27 detects the voltage DV of the selected word line WLs through the VPGM monitor 34 is two, and the sequencer 27 determines whether writing has been successful based on a result of determination for the detected voltages DVT11 and DVT12. Note that the number of voltage detection times is two in the present modification but may be larger.

Whether data writing has been successful can be more accurately determined when a plurality of voltage detection times are provided.

For example, consider a case in which the detected voltage DVT11 exceeds the predetermined value TH at first detection timing T11 but the detected voltage DVT12 is lower than the predetermined value TH at second detection timing T12. In this case, the sequencer 27 may determine that writing has been successful because the detected voltage DVT11 is higher than the predetermined value TH.

The sequencer 27 may determine that writing has been successful also when the detected voltage DVT11 is lower than the predetermined value TH at first detection timing T11 but the detected voltage DVT12 exceeds the predetermined value TH at second detection timing T12.

Otherwise, it may be determined that writing has been unsuccessful when detected voltage does not exceed the predetermined value TH both at first detection time T11 and second detection time T12. The predetermined value may be changed to TH1 and TH2 between first detection time T11 and second detection time T12. The predetermined value TH1 at first detection time T11 may be higher or lower than the predetermined value TH2 at second detection time T12. Thus, the predetermined value may be set to different values at a plurality of detection times.

The predetermined value TH is optionally set in advance in the above-described embodiment and modifications, but may be set based on a set voltage (also called a trim voltage) at writing. The set voltage (trim voltage) at writing is set and stored in each non-volatile memory 2 based on individual characteristics of the non-volatile memory 2 at manufacturing of the non-volatile memory 2.

Figure 13:
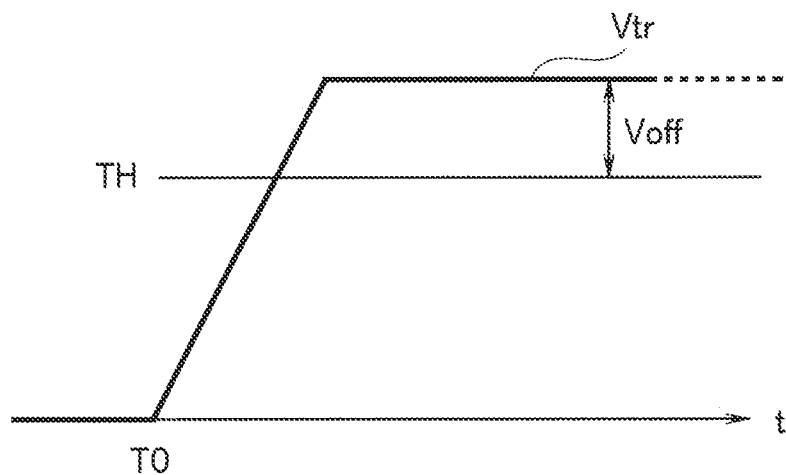
FIG. 13 is a diagram illustrating a predetermined-value setting method in Modification 5 of the present embodiment.

FIG. 13 is a diagram illustrating a method of setting the predetermined value TH in Modification 5. In FIG. 13, the predetermined value TH is set based on an offset voltage value Voff from trim voltage Vtr. In other words, the predetermined value TH is set based on the trim voltage set in accordance with the individual characteristics of the non-volatile memory 2.

Setting of the offset voltage value Voff is changeable. Thus, the voltage of the selected word line WLs can be reliably detected by changing the offset voltage value Voff in accordance with characteristics of each semiconductor storage device.

(Modification 6)

In Modification 5 described above, the predetermined value TH is set based on the offset voltage value Voff from the set voltage (what is called trim voltage) at writing, but may be set based on a ratio relative to the set voltage (what is called trim voltage) at writing.

Figure 14:
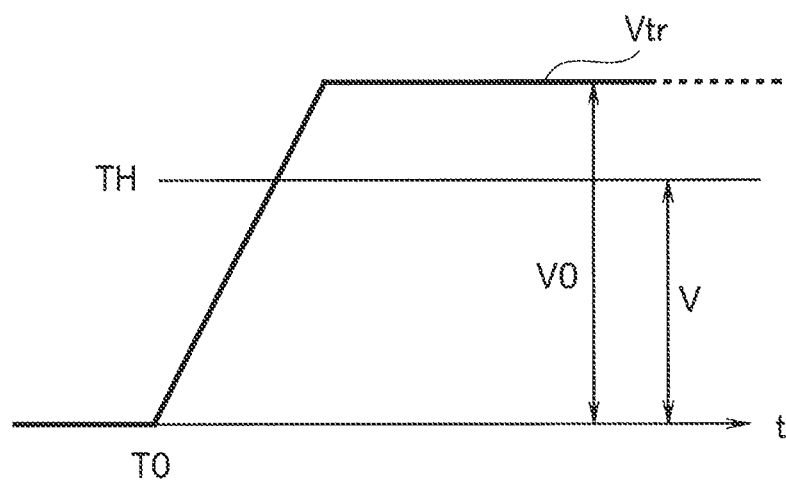
FIG. 14 is a diagram illustrating a predetermined-value setting method in Modification 6 of the present embodiment.

FIG. 14 is a diagram illustrating a method of setting the predetermined value TH in Modification 6. In FIG. 14, the predetermined value TH (V) is set by using a ratio k relative to the trim voltage Vtr (V0). The ratio k is (V/V0). In other words, the predetermined value TH is set based on the trim voltage set in accordance with the individual characteristics of the non-volatile memory 2.

Setting of the ratio k is changeable. Thus, the voltage of the selected word line WLs can be reliably detected by changing the ratio k in accordance with characteristics of each semiconductor storage device.

(Modification 7)

In the above-described embodiment and modifications, whether the threshold voltage of each memory cell transistor MT has reached desired threshold voltage is checked without verify operation in writing operation, but whether data at each memory cell transistor has been erased may be checked by detecting erasure voltage without verify operation in data erasure operation as well.

Figure 15:
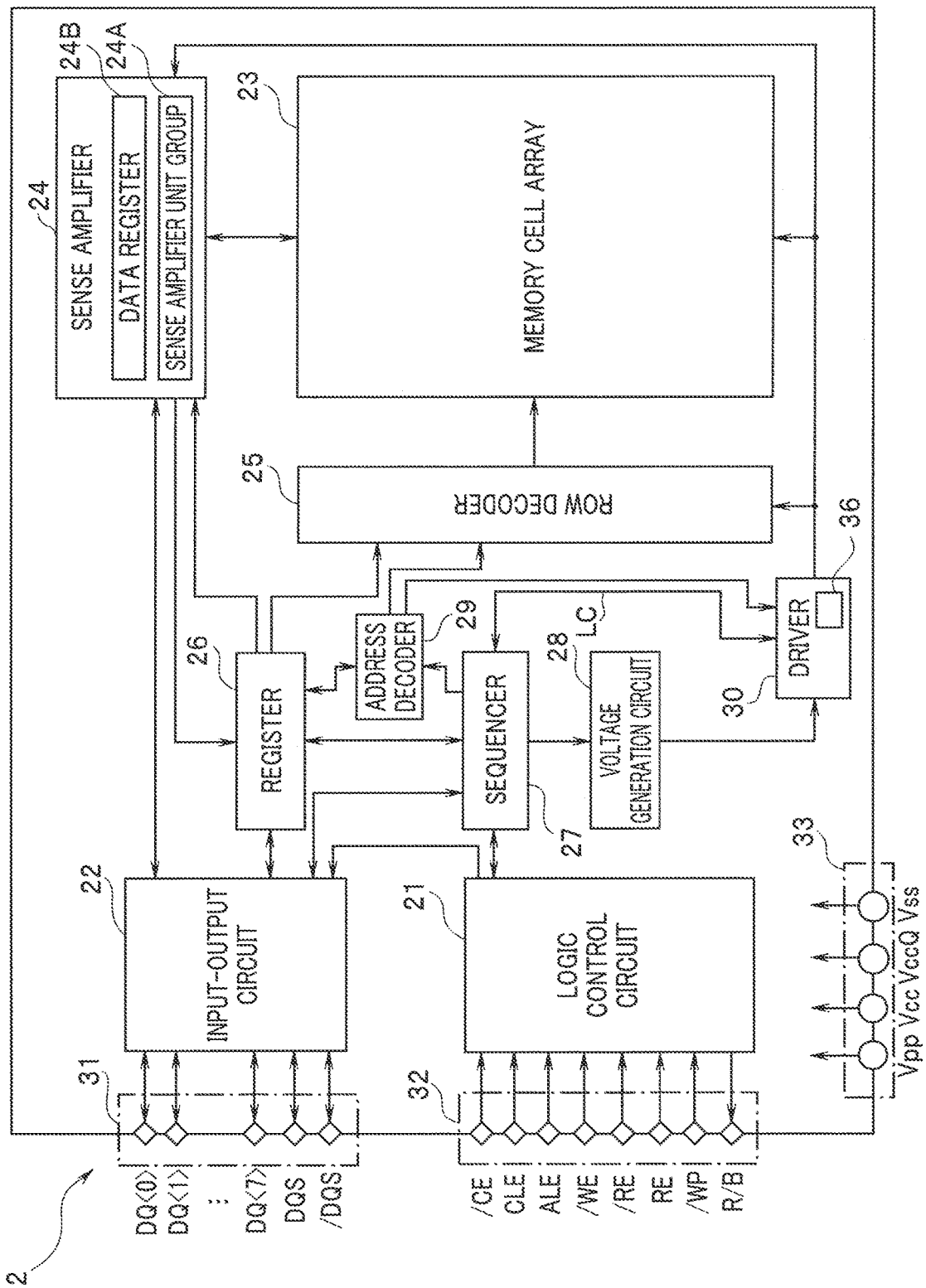
FIG. 15 is a block diagram of a non-volatile memory in Modification 7 of the present embodiment.

FIG. 15 is a block diagram of the non-volatile memory 2 in Modification 7. In FIG. 15, any component same as that in FIG. 2 is denoted by the same reference sign, and description thereof is omitted, but the following description will be made on any different component.

Erasure voltage VERA is applied to the source line SL. The source line SL is connected in common to source sides of a plurality of memory cell transistors MT. The voltage applied to the source line SL is detected by a VERA monitor 36 provided to the source line SL in the driver 30. Specifically, the VERA monitor 36 is a voltage detection circuit connected to the source line SL and configured to detect the voltage of the source line SL.

Figure 16:
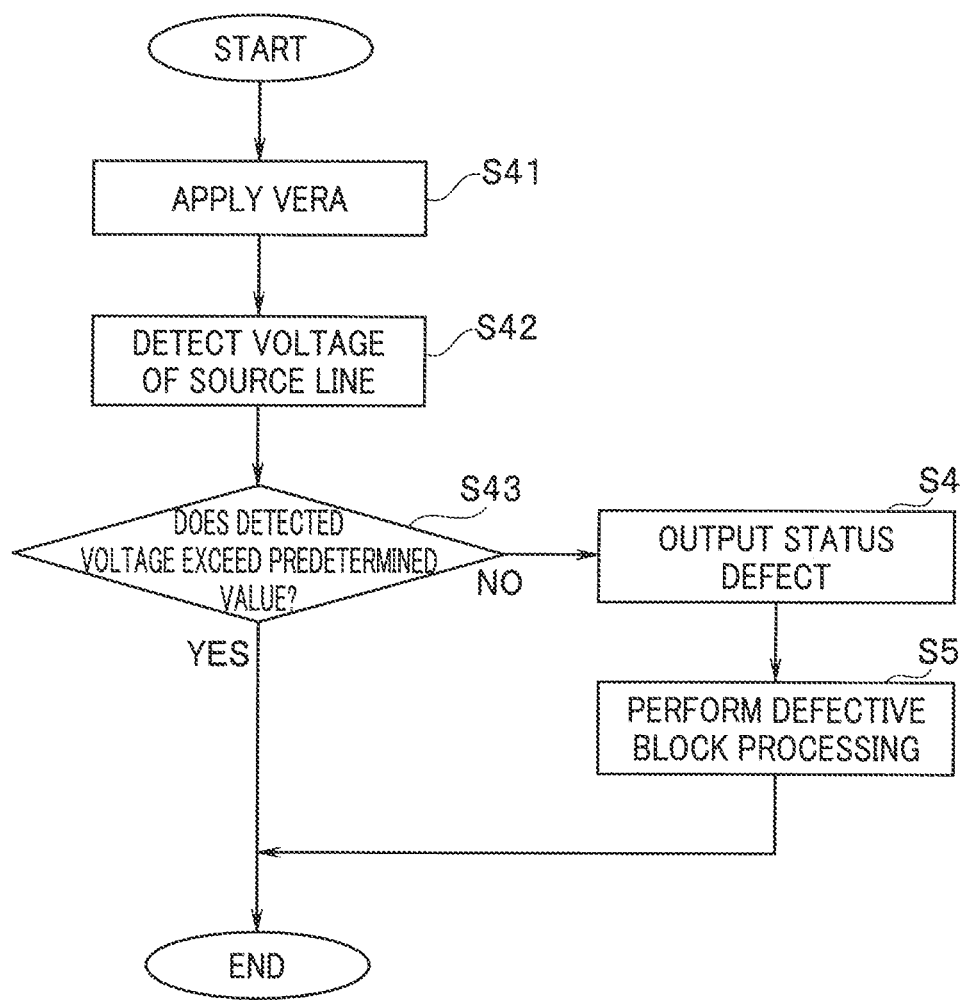
FIG. 16 is a flowchart illustrating erasure operation in Modification 7 of the present embodiment.

FIG. 16 is a flowchart illustrating erasure operation in Modification 7.

At step S41, the predetermined erasure voltage VERA is applied to the source line SL.

At step S42, the voltage of the source line SL after the application of the erasure voltage VERA is detected. The sequencer 27 detects the voltage of the source line SL after the application of the erasure voltage VERA by controlling the VERA monitor 36 provided to the source line SL through the control signal line LC. As illustrated in FIG. 6, the voltage of the source line SL is detected at detection timing T1 after the predetermined time Tp has elapsed since application timing T0 of the erasure voltage VERA. The predetermined time Tp is set in advance.

Note that the voltage of the source line SL can be substituted into the voltage DV in FIGS. 6, 11, and 12.

At step S43, it is determined whether the detected voltage DVT1 of the source line SL detected by the VERA monitor 36 exceeds a predetermined value THe. Note that the predetermined value THe can be substituted into the predetermined value TH in FIGS. 6, 11, 12, 13, and 14.

The predetermined value THe is voltage set in advance so that data at each memory cell transistor MT is erased when voltage exceeding the predetermined value THe is applied to the source line SL.

When the detected voltage DVT1 exceeds the predetermined value THe (YES at S43), the sequencer 27 ends processing in FIG. 16. In this case, for example, the voltage DV changes as illustrated with a solid line.

When the detected voltage DVT1 does not exceed the predetermined value THe (NO at S43), a status defect is output to the memory controller 1 at step S4 and the defective block processing is executed at step S5. In this case, for example, the voltage DV changes as illustrated with a dashed and double-dotted line.

As described above, when the erasure voltage VERA is applied to the source line SL at data erasure from the memory cell array 23, the sequencer 27 detects the voltage of the source line SL through the VERA monitor 36 and determines whether the detected voltage DVT1 obtained through the detection has reached a predetermined value.

In the present modification as well, setting of detection times may be changeable as in Modification 3 illustrated in FIG. 11.

In the present modification as well, the number of detection times may be two or more as in Modification 4 illustrated in FIG. 12.

In the present modification as well, the predetermined value THe may be set based on the offset voltage from the set voltage (what is called trim voltage Vtr) at erasure as in Modification 5 illustrated in FIG. 13. Note that the set voltage Vtr applied to the source line SL at erasure can be substituted into Vtr in FIGS. 13 and 14.

In the present modification as well, the predetermined value THe may be set based on the ratio relative to the set voltage (what is called trim voltage Vtr) at erasure as in Modification 6.

As described above, according to the above-described embodiment and modifications, data writing or erasure can be performed at high speed in the memory system since verify operation is not executed in writing operation or erasure operation.

Thus, according to the present embodiment, it is possible to provide a semiconductor storage device having improved writing performance.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array including a plurality of memory cell transistors;
   a plurality of word lines respectively connected to a plurality of gates of the plurality of memory cell transistors;
   a voltage detection circuit connected to at least one of the plurality of word lines; and
   a control circuit configured to detect, when a writing voltage is applied to a selected word line selected from among the plurality of word lines at a time of data writing to the memory cell array, a voltage of the selected word line through the voltage detection circuit, and to perform a determination as to whether the detected voltage obtained through the detection has reached a predetermined value,
   wherein a setting of a number of times that the control circuit detects the voltage of the selected word line through the voltage detection circuit is changeable.

2. The semiconductor storage device according to claim 1, wherein the number of times is once.

3. The semiconductor storage device according to claim 1, wherein each of the plurality of memory cell transistors stores one bit of data.

4. The semiconductor storage device according to claim 1, wherein:
   each of the plurality of memory cell transistors is a multiple-value cell that can store a plurality of bits of data,
   there are a plurality of the predetermined values to distinguish between the plurality of bits of data, and
   the control circuit determines whether the detected voltage has reached each of the plurality of predetermined values.

5. The semiconductor storage device according to claim 1, wherein the predetermined value is set based on a trim voltage set in accordance with individual characteristics of the semiconductor storage device.

6. The semiconductor storage device according to claim 1, wherein:
   the plurality of memory cell transistors are divided into a plurality of blocks in the memory cell array, and
   the voltage detection circuit is connected to a global word line through which a plurality of signals including the writing voltage are supplied to the plurality of blocks.

7. The semiconductor storage device according to claim 1, wherein:
   the plurality of memory cell transistors are divided into a plurality of blocks in the memory cell array, and the voltage detection circuit is connected to a local word line in each of the plurality of blocks.

8. A semiconductor storage device comprising:
a memory cell array including a plurality of memory cell transistors;
a plurality of word lines respectively connected to a plurality of gates of the plurality of memory cell transistors;
a voltage detection circuit connected to at least one of the plurality of word lines; and
a control circuit configured to detect, when a writing voltage is applied to a selected word line selected from among the plurality of word lines at a time of data writing to the memory cell array, a voltage of the selected word line through the voltage detection circuit, and to perform a determination as to whether the detected voltage obtained through the detection has reached a predetermined value,
wherein:
the control circuit detects the voltage of the selected word line through the voltage detection circuit at each of a plurality of times, and
the control circuit performs the determination based on determination results of a plurality of detected voltages.

9. The semiconductor storage device according to claim 8, wherein the predetermined value is set based on a trim voltage set in accordance with individual characteristics of the semiconductor storage device.

10. The semiconductor storage device according to claim 8, wherein:
the plurality of memory cell transistors are divided into a plurality of blocks in the memory cell array, and
the voltage detection circuit is connected to a global word line through which a plurality of signals including the writing voltage are supplied to the plurality of blocks.

11. The semiconductor storage device according to claim 8, wherein:
the plurality of memory cell transistors are divided into a plurality of blocks in the memory cell array, and
the voltage detection circuit is connected to a local word line in each of the plurality of blocks.

12. A semiconductor storage device comprising:
a memory cell array including a plurality of memory cell transistors;
a plurality of word lines respectively connected to a plurality of gates of the plurality of memory cell transistors;
a voltage detection circuit connected to at least one of the plurality of word lines; and
a control circuit configured to detect, when a writing voltage is applied to a selected word line selected from among the plurality of word lines at a time of data writing to the memory cell array, a voltage of the selected word line through the voltage detection circuit, and to perform a determination as to whether the detected voltage obtained through the detection has reached a predetermined value,
wherein the control circuit performs a verify operation for the data writing to the memory cell array and performs the determination in response to verify not passing as a result of the verify operation.

13. The semiconductor storage device according to claim 12, wherein the predetermined value is set based on a trim voltage set in accordance with individual characteristics of the semiconductor storage device.

14. The semiconductor storage device according to claim 12, wherein:
the plurality of memory cell transistors are divided into a plurality of blocks in the memory cell array, and
the voltage detection circuit is connected to a global word line through which a plurality of signals including the writing voltage are supplied to the plurality of blocks.

15. The semiconductor storage device according to claim 12, wherein:
the plurality of memory cell transistors are divided into a plurality of blocks in the memory cell array, and
the voltage detection circuit is connected to a local word line in each of the plurality of blocks.

16. A semiconductor storage device comprising:
a memory cell array including a plurality of memory cell transistors;
a plurality of word lines respectively connected to a plurality of gates of the plurality of memory cell transistors;
a voltage detection circuit connected to at least one of the plurality of word lines; and
a control circuit configured to detect, when a writing voltage is applied to a selected word line selected from among the plurality of word lines at a time of data writing to the memory cell array, a voltage of the selected word line through the voltage detection circuit, and to perform a determination as to whether the detected voltage obtained through the detection has reached a predetermined value,
wherein:
the plurality of memory cell transistors are divided into a plurality of blocks in the memory cell array, and
the control circuit performs processing of handling a block including the selected word line, the detected voltage of which has not reached the predetermined value, as a defective block.

17. The semiconductor storage device according to claim 16, wherein each of the plurality of memory cell transistors stores one bit of data.

18. The semiconductor storage device according to claim 16, wherein:
each of the plurality of memory cell transistors is a multiple-value cell that can store a plurality of bits of data,
there are a plurality of the predetermined values to distinguish between the plurality of bits of data, and
the control circuit determines whether the detected voltage has reached each of the plurality of predetermined values.

19. The semiconductor storage device according to claim 16, wherein:
the plurality of memory cell transistors are divided into a plurality of blocks in the memory cell array, and
the voltage detection circuit is connected to a local word line in each of the plurality of blocks.

* * * * *